United States Patent
Nagai et al.

(10) Patent No.: US 6,451,707 B2
(45) Date of Patent: Sep. 17, 2002

(54) METHOD OF REMOVING REACTION PRODUCT DUE TO PLASMA ASHING OF A RESIST PATTERN

(75) Inventors: Toshihiko Nagai; Yuichi Miyoshi, both of Osaka (JP)

(73) Assignee: Matsushita Electronics Corporation, Osaka J (JP)

( * ) Notice: Subject to any disclaimer, the term of this patent is extended or adjusted under 35 U.S.C. 154(b) by 0 days.

(21) Appl. No.: 09/729,202

(22) Filed: Dec. 5, 2000

(30) Foreign Application Priority Data

Dec. 7, 1999 (JP) .............................. 11-347059

(51) Int. Cl.$^7$ .................... H01L 21/461; B08B 6/00; C25E 1/00
(52) U.S. Cl. ................. 438/725; 438/745; 438/749; 134/1.2; 134/1.3
(58) Field of Search ................. 438/725, 745, 438/749; 134/1–13; 216/104, 103, 108, 109

(56) References Cited

U.S. PATENT DOCUMENTS 5,650,041 A * 7/1997 Gotoh et al. ............. 156/653.1
6,129,091 A * 10/2000 Lee et al. .................. 134/3
6,245,155 B1 * 6/2001 Leon et al. ................. 134/3
6,248,704 B1 * 6/2001 Small et al. ............... 510/176

FOREIGN PATENT DOCUMENTS

| EP | 690486 A2 | * 1/1996 |
| JP | 06-120191 | 4/1994 |
| JP | 07-201794 | 8/1995 |
| JP | 09-043857 | 2/1997 |
| JP | 09-213612 | 8/1997 |
| JP | 09-330981 | 12/1997 |
| JP | 10-055993 | 2/1998 |

* cited by examiner

Primary Examiner—Ha Tran Nguyen
(74) Attorney, Agent, or Firm—Nixon Peabody LLP; Donald P. Studebaker

(57) ABSTRACT

After forming a processed film onto the underlying film formed on the substrate, the processed film is dry etched using a mask pattern so as to form an etched pattern. After the reaction product deposited on a wall of the etched pattern is removed by using the first cleaning solution having relatively low power to etch the processed film and the second cleaning solution having relatively high power to etch the processed film in that order, the etched pattern or its vicinity is rinsed with water.

14 Claims, 5 Drawing Sheets

METHOD OF REMOVING REACTION PRODUCT DUE TO PLASMA ASHING OF A RESIST PATTERN

BACKGROUND OF THE INVENTION

The present invention relates to a method for fabricating an electronic device, and more specifically, to a method for removing a reaction product deposited on walls or other portions of a pattern formed by dry etching a processed film such as a conductor film or an insulator film.

In the fabrication of electronic devices, a dry etching technique is often used to form a via hole in an insulator film or to form a conductor film into a wiring pattern. It is known that etching gas, photoresist or a processed film causes a reaction product (a sidewall protective film or a polymer residue) to be deposited on walls of the via hole or the wiring pattern. The deposition of the reaction product on the bottom surface of the via hole formed in the insulator film would cause junction failure, an increase in the resistance of the via contact or corrosion of the wiring pattern (underlying wiring), thereby seriously damaging the reliability of the electronic device.

In order to remove the reaction product, there is a cleaning solution (hereinafter referred to as the conventional cleaning solution) which comprises an aqueous solution of an organic solvent and a fluorine compound having power to etch the insulator film (Refer to Japanese Laid-Open Patent Application Nos. 7-201794 and 10-55993).

In recent years, as electronic devices are highly micromachined, new resist materials have been introduced to increase the etch selectivity, and new etching gases ($C_5F_8$ and the like) with a small global warming coefficient have been introduced to show consideration for environmental problems. As a result, a reaction product having different components from conventional ones is caused in higher volume, making it difficult to remove the reaction product by using the conventional cleaning solution.

SUMMARY OF THE INVENTION

In view of the above-mentioned problems, the object of the present invention is to secure the removal of the reaction product deposited on walls or other portions of an etched pattern.

In order to meet the object, the inventors of the present invention have studied the relationship between the amount of a fluorine compound contained in a cleaning solution and the solution's capability of removing the reaction product.

The method for fabricating the electronic device of a first comparative example will be described as follows with reference to FIGS. 3(a) to 3(c) by taking as an example the case where a via hole is formed by dry etching an insulator film on a wiring and then the reaction product deposited on walls or other portions of the via hole is removed by using a cleaning solution having a relatively low content of a fluorine compound, or having relatively low power to etch the insulator film.

As shown in FIG. 3(a), an underlying wiring 4 having a multi-layer structure consisting of a first titanium nitride film 2A, an aluminum alloy film 3 and a second titanium nitride film 2B was formed onto a substrate 1. After this, an insulator film 5 was formed on the underlying wiring 4, and then a resist pattern 6 having an opening portion in the via hole formation region was formed on the insulator film 5.

Later, the insulator film 5 and the second titanium nitride 2B were sequentially dry etched with the resist pattern 6 as a mask so as to form a via hole 7 as shown in FIG. 3(b), which was followed by the removal of the resist pattern 6 through plasma ashing. At this moment, a reaction product 8 was deposited on walls and the bottom surface of the via hole 7.

The inside of the via hole 7 was washed with the cleaning solution having a relatively low content of a fluorine compound such as ELM-C30-A01 (hereinafter referred to as the cleaning solution A) manufactured by Mitsubishi Gas Chemical Co., Ltd. for 10 to 20 minutes at room temperature (23° C.), and then rinsed with water. Later, the substrate 1 was dried.

Consequently, as shown in FIG. 3(c), the portion of the reaction product 8 that had been deposited on the bottom surface of the via hole 7 remained unremoved. In a later process, when a conductor film was buried into the via hole 7 to form a via contact, and an overlying wiring was formed in such a manner as to be connected with the underlying wiring 4 via the via contact, the overlying wiring and the underlying wiring 4 had a junction failure. For this reason, the resistance value of the via contact could not be measured.

Thus, when the cleaning solution has a relatively low content of a fluorine compound, the solution's capability of removing the reaction product greatly relies on the ability of the organic solvent contained in the cleaning solution to dissolve the reaction product. Therefore, not only it takes more time to remove the reaction product, but also it becomes difficult to remove the product entirely.

The method for fabricating the electronic device of a second comparative example will be described as follows with reference to FIGS. 4(a) to 4(c) by taking as an example the case where a via hole is formed by dry etching an insulator film on a wiring and then the reaction product deposited on walls or other portions of the via hole is removed by using a cleaning solution having a relatively high content of a fluorine compound, or having relatively high power to etch the insulator film. The processes shown in FIGS. 4(a) and 4(b) in the second comparative example will not be explained because they are the same as the processes shown in FIGS. 3(a) and 3(b) in the first comparative example.

In the second comparative example, the inside of the via hole 7 was washed with a cleaning solution having a relatively high content of a fluorine compound such as ELM-C30-A10 (hereinafter referred to as the cleaning solution B) manufactured by Mitsubishi Gas Chemical Co., Ltd. for 10 to 20 minutes at room temperature (23° C.), and then rinsed with water. After this, the substrate 1 was dried. The cleaning solution B contains about 8 times as much fluorine compound, and has 50 to 200 times as high power to etch an insulator film as the cleaning solution A. The etching power can be the amount of etching the same type of insulator film in the same duration in time.

As a result, as shown in FIG. 4(c), while the reaction product 8 was entirely removed, the portion of the insulator film 5 that was in the vicinity of the via hole 7 was also removed at the same time. In FIG. 4(c) the broken line indicates the positions of the walls and bottom surface of the via hole 7 formed at predetermined dimensions.

If the inside of the via hole 7 washed with the cleaning solution B is then rinsed with water, the cleaning solution B diluted with the water will become capable of corroding the conductor film contained in the underlying wiring 4, namely, the aluminum alloy film 3. To be more specific, the ability of the cleaning solution B to corrode the aluminum alloy film 3 during the rinse with water, that is, the cleaning solution B's capability of corroding the aluminum alloy film 3 in the rinse water is about 3 times as high as the cleaning solution A's capability (the maximum value) of corroding the aluminum alloy film 3 in the rinse water.

FIG. 5(a) is a schematic view of the strengths of streams of water inside the via hole 7 while it is being rinsed with water according to the method for fabricating the electronic device of the second comparative example. The arrows "a" to "e" represent streams of water at the respective portions inside the via hole 7, and their lengths correspond to the strengths of the streams of water.

FIG. 5(b) shows changes in the concentration of the cleaning solution B inside the via hole 7 while it is being rinsed with water according to the method for fabricating the electronic device of the second comparative example. The changes in the concentration of the cleaning solution B are shown in correspondence with the streams of water indicated by the arrows "a" to "e" of FIG. 5(a).

As shown in FIG. 5(a), the streams of water become less and less powerful as they are closer to the bottom surface of the via hole 7. The reason for this is considered that the strengths of the streams of water inside the via hole 7 depend on the rate of dispersion of the water stream at the top of the via hole 7. As shown in FIG. 5(b) the closer to the bottom surface of the via hole 7, the less the concentration of the cleaning solution B decreases, which causes the portion of the aluminum alloy film 3 that is exposed to the via hole 7 to be in contact with the cleaning solution B for a long time. As a result, in addition to the remaining portion of the reaction product 8 being removed, the exposed portion of the aluminum alloy film 3 is corroded and dissolved to form a hollow portion 9 beneath the insulator film 5 as shown in FIG. 4(c). This results in the formation of a hydroxide in the vicinity of the hollow portion 9 in the aluminum alloy film 3. The via contact formed by burying a conductive film into the via hole 7 was subjected to an acceleration test, and more specifically, a high-temperature storage resistance increase rate test conducted for 1000 hours at a high temperature of 200° C. to find that the rate of increase in the resistance value of the via contact (hereinafter referred to as the rate of increase in the via resistance) was over 10%.

The results of the test indicate that a cleaning solution with a relatively high content of a fluorine compound makes the insulator film which underlies the reaction product be etched so as to make it easy to remove the reaction product; however, at the same time, the cleaning solution causes the via hole formed in the insulator film to grow in size and the portion of the conductor film contained in the underlying wiring which is exposed to the via hole to be corroded.

The present invention has been contrived based on the above-mentioned findings. To be more specific, the first method for fabricating the electronic device of the present invention comprises: a first process of forming an insulator film onto a conductive pattern formed on a substrate; a second process of forming an opening portion in said insulator film by dry etching said insulator film using a resist pattern as a mask; a third process of removing a reaction product deposited on a wall or a bottom surface of said opening portion; and a fourth process of rinsing an inside of said opening portion rid of said reaction product with water, the third process including a process of removing said reaction product by using a first cleaning solution having relatively low power to etch said insulator film and a second cleaning solution having relatively high power to etch said insulator film in that order.

In the first method for fabricating the electronic device, the reaction product deposited on walls or the bottom surface of the opening portion formed in the insulator film is removed by using the first cleaning solution with relatively low power to etch the insulator film and the second cleaning solution with relatively high power to etch the insulator film in that order. In this case, the reaction product can be partly removed by the first cleaning solution, and then the remaining part of it can be removed by the second cleaning solution. This can shorten the time to use the second cleaning solution, compared with the case where the reaction product is removed by the second cleaning solution only, which reduces the amount of etching the insulator film. This secures the removal of the reaction product without increasing the opening portion in size.

In the first method of fabricating the electronic device, it is preferable that the first cleaning solution and the second cleaning solution contain the same organic solvent.

In this case, it becomes unnecessary to provide each cleaning solution with an individual drain line, which realizes the centralization of the drain lines.

In the first method of fabricating the electronic device, it is preferable that the first cleaning solution and the second cleaning solution are used in the same cleaning chamber.

In this case, the time required for the removal of the reaction product can be reduced.

The first method of fabricating the electronic device preferably further comprises, between the third process and the fourth process, another process for washing the inside of said opening portion rid of said reaction product by using a third cleaning solution having a lower capability of corroding said conductor pattern in the fourth process than the second cleaning solution.

In this case, after the removal of the reaction product by the second cleaning solution and before the inside of the opening portion is rinsed with water, the second cleaning solution remaining inside the opening portion is replaced by the third cleaning solution. Consequently, the amount of corroding the conductor pattern during the rinse with water can be less than in the case where the inside of the opening portion is rinsed with water immediately after the second cleaning solution is used, which can decrease the size of the hollow portion formed beneath the insulator film.

When the third cleaning solution is used, the third cleaning solution preferably has relatively low power to etch said insulator film.

In this case, the amount of etching the insulator film can be reduced, so that the opening portion can be prevented from increasing in size.

When the third cleaning solution is used, the third cleaning solution is preferably the same as the first cleaning solution.

In this case, the number of types of the cleaning solutions used in the cleaning process can be reduced.

When the third cleaning solution is used, it is preferable that the third cleaning solution substantially has no power to etch said insulator film and substantially has no capability of corroding said conductive pattern in the fourth process.

In this case, it can be secured to prevent the conductor pattern from being corroded during the rinse with water, while the opening portion is prevented from increasing in size.

The second method for fabricating the electronic device of the present invention comprises: a first process for forming a processed film on an underlying film formed on a substrate; a second process for forming an etched pattern by dry etching said processed film using a mask pattern; a third process for removing a reaction product deposited on a wall of said etched pattern; and a fourth process for rinsing said etched pattern or a vicinity thereof rid of said reaction product with water, the third process containing a process for removing said reaction product by using a first cleaning solution having relatively low power to etch said processed film and a second cleaning solution having relatively high power to etch said processed film in that order.

In the second method for fabricating the electronic device, the reaction product deposited on walls of the etched pattern is removed by using the first cleaning solution with relatively low power to etch the processed film and the second cleaning solution with relatively high power to etch the processed film in that order. In this case, the reaction product can be partly removed by the first cleaning solution, and then the remaining part of it can be removed by the second cleaning solution. This can shorten the time to use the second cleaning solution, compared with the case where the reaction product is removed by the second cleaning solution only, which reduces the amount of etching the processed film. This secures the removal of the reaction product without changing the size of the etched pattern.

In the second method of fabricating the electronic device, the first cleaning solution and the second cleaning solution preferably contain the same organic solvent.

In this case, it becomes unnecessary to provide each cleaning solution with an individual drain line, which realizes the centralization of the drain lines.

In the second method of fabricating the electronic device, the first cleaning solution and the second cleaning solution are preferably used in the same cleaning chamber.

In this case, the time required for the removal of the reaction product can be reduced.

The second method of fabricating the electronic device preferably further comprises, between the third process and the fourth process, another process for washing said etched pattern or said vicinity thereof rid of said reaction product by using a third cleaning solution having a lower capability of corroding said underlying film in the fourth process than the second cleaning solution.

In this case, after the removal of the reaction product by the second cleaning solution and before the etched pattern or its vicinity are rinsed with water, the second cleaning solution remaining on the etched pattern or its vicinity is replaced by the third cleaning solution. Consequently, the amount of corroding the underlying film during the rinse with water can be less than in the case where the etched pattern or its vicinity is rinsed with water immediately after the second cleaning solution is used.

When the third cleaning solution is used, the third cleaning solution preferably has relatively low power to etch said processed film.

In this case, the amount of etching the processed film can be reduced, so that the etched pattern can be prevented from changing in size.

When the third cleaning solution is used, the third cleaning solution is preferably the same as the first cleaning solution.

In this case, the number of types of the cleaning solutions used in the cleaning process can be reduced.

When the third cleaning solution is used, it is preferable that the third cleaning solution substantially has no power to etch said processed film and substantially has no capability of corroding said underlying film in the fourth process.

In this case, it can be secured to prevent the underlying film from being corroded during the rinse with water, while the etched pattern is prevented from changing in size.

DETAILED DESCRIPTION OF THE PRESENT INVENTION

EMBODIMENT 1

The method for fabricating the electronic device of the first embodiment will be described as follows with reference to FIGS. 1(a) to 1(d).

Figure 1A:
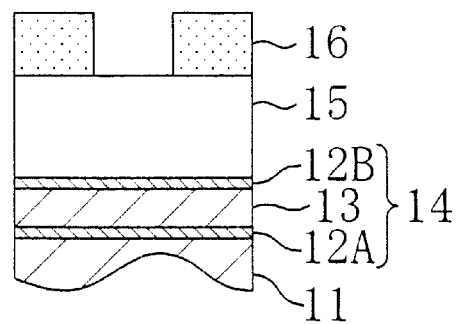
FIGS. 1(a) to 1(d) are cross sectional views showing the processes of the method for fabricating the electronic device of the first embodiment of the present invention.

First, as shown in FIG. 1(a), an underlying wiring 14 having a multi-layer structure consisting of a first titanium nitride film 12A, an aluminum alloy film 13 and a second titanium nitride film 12B is formed onto a substrate 11. After this, an insulator film 15 is formed on the underlying wiring 14, and a resist pattern 16 having an opening portion in the via hole formation region is formed on the insulator film 15.

Figure 1B:
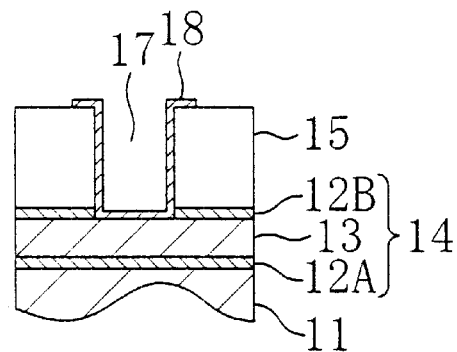

Later, the insulator film 15 and a second titanium nitride film 12B are sequentially dry etched by using the resist pattern 16 as a mask so as to form a via hole 17 as shown in FIG. 1(b), which is followed by the removal of the resist pattern 16 through plasma ashing.

At this moment, a reaction product 18 is deposited on walls and the bottom surface of the via hole 17.

In order to remove the reaction product 18, the inside of the via hole 17 is washed with a first cleaning solution having relatively low power to etch the insulator film 15, or having a relatively low content of a fluorine compound such as ELM-C30-A01 (hereinafter referred to as the cleaning solution A) manufactured by Mitsubishi Gas Chemical Co., Ltd. for 10 to 20 minutes at room temperature or 23° C.

Figure 1C:
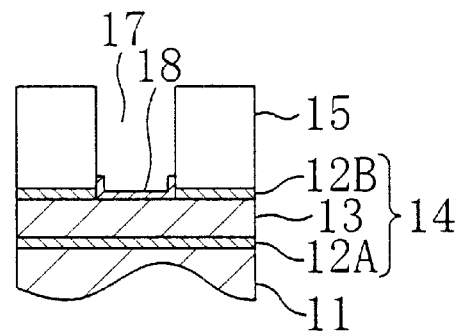

Since the first cleaning solution has relatively low power to etch the insulator film 15, the reaction product 18 is removed from the via hole 17 except the bottom surface of the via hole 17 and its vicinity as shown in FIG. 1(c) without causing an increase in the size of the via hole 17.

In order to remove the remaining reaction product 18, the inside of the via hole 17 is washed with a second cleaning solution having relatively high power to etch the insulator film 15, or having a relatively high content of a fluorine compound such as ELM-C30-A10 (herein after referred to as the cleaning solution B) manufactured by Mitsubishi Gas Chemical Co., Ltd. at room temperature or 23° C. for 30 seconds to 5 minutes in the cleaning chamber (not shown) where the first cleaning solution has been used. The cleaning solution B contains about 8 times as much fluorine compound, and has 50 to 200 times as high power to etch the insulator film 15 as the cleaning solution A. The etching power can be the amount of etching the same type of insulator film in the same duration in time.

Figure 1D:
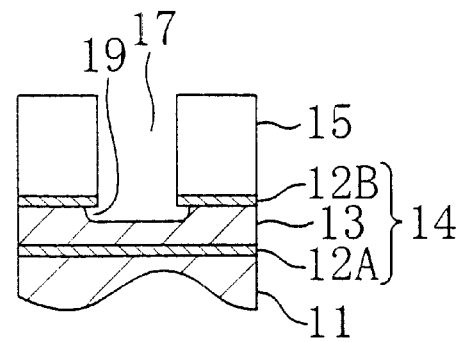

In this case, the reaction product 18 is partly removed by using the first cleaning solution having relatively low power to etch the insulator film 15, and then the remaining part of it is removed by using the second cleaning solution having relatively high power to etch the insulator film 15. This shortens the time to use the second cleaning solution, compared with the case where the reaction product 18 is removed by the second cleaning solution only. As a result, as shown in FIG. 1(d), the amount of etching the insulator film 15 can be reduced, which secures the removal of the reaction product 18 without increasing the via hole 17 in size.

If the inside of the via hole 17 washed with the second cleaning solution or the cleaning solution B were rinsed with water immediately, the cleaning solution B diluted by the water during the rinse would become capable of corroding the conductor film contained in the underlying wiring 14, namely, the aluminum alloy film 13. To be more specific, the ability of the cleaning solution B to corrode the aluminum alloy film 13 during the rinse with water, that is, the cleaning solution B's capability of corroding the aluminum alloy film 13 in rinse water, is about 3 times as high as the cleaning solution A's capability (the maximum value) of corroding the aluminum alloy film 13 in rinse water.

In order to avoid this problem, in the present embodiment, after the reaction product 18 is removed with the second cleaning solution and before the inside of the via hole 17 is rinsed with water, the second cleaning solution or the cleaning solution B remaining inside the via hole 17 is replaced by a third cleaning solution having a lower capability of corroding the aluminum alloy film 13 during the rinse with water than the second cleaning solution (the cleaning solution B). To be more specific, the inside of the via hole 17 is washed with the cleaning solution A identical with the first cleaning solution as the third cleaning solution at room temperature or 23° C. for 30 seconds to 10 minutes in the cleaning chamber where the first and second cleaning solutions have been used. In this case, the aluminum alloy film 13 can be less corroded during the rinse with water than in the case where the inside of the via hole 17 is rinsed with water immediately after the second cleaning solution is used. Later, after the inside of the via hole 17 is rinsed with water in the cleaning chamber where the first to third cleaning solutions have been used, the substrate 11 is dried.

As described hereinbefore, in the present embodiment the reaction product 18 deposited on walls or the bottom surface of the via hole 17 formed in the insulator film 15 is removed by using the first cleaning solution with relatively low power to etch the insulator film 15 and the second cleaning solution with relatively high power to etch the insulator film 15 in that order. In this case, the reaction product 18 can be partly removed by the first cleaning solution, and then the remaining part of it can be removed by the second cleaning solution. This can shorten the time to use the second cleaning solution, compared with the case where the reaction product 18 is removed by the second cleaning solution only, thereby reducing the amount of etching the insulator film 15. This secures the removal of the reaction product 18 without increasing the via hole 17 in size.

Furthermore, after the reaction product 18 is removed with the first and second cleaning solutions and before the inside of the via hole 17 is rinsed with water, the inside of the via hole 17 is washed with a third cleaning solution having a lower capability of corroding the aluminum alloy film 13 contained in the underlying wiring 14 during the rinse with water than the second cleaning solution, thereby replacing the second cleaning solution remaining inside the via hole 17 by the third cleaning solution. As a result, the aluminum alloy film 13 is less corroded than in the case where the inside of the via hole 17 is rinsed with water immediately after the second cleaning solution is used, which decreases the size of the hollow portion 19 formed beneath the insulator film 15. Moreover, a less amount of hydroxide can be formed in the vicinity of the hollow portion 19 in the aluminum alloy film 13. As a result, an acceleration test (high-temperature storage resistance increase rate test) applied to the via contact formed by burying a conductor film into the via hole 17 has indicated that an increase in the resistance value of the via contact is prevented.

In the present embodiment, the use of the cleaning solution A which is identical with the first cleaning solution and which has relatively low power to etch the insulator film 15 as the third cleaning solution can reduce not only the number of types of the cleaning solutions used in the cleaning process but also the amount of etching the insulator film 15 so as to prevent an increase in the size of the via hole 17.

Table 1 shows the results of comparisons among the first embodiment, the first comparative example and the second comparative example (refer to "SUMMARY OF THE INVENTION") with respect to the capabilities of removing the reaction product, preventing an increase in the size of the via hole, preventing the formation of the hollow portion, and preventing an increase in the resistance value of the via contact at the high-temperature storage resistance increase rate test (200° C., 1000 hours).

TABLE 1

|  | removal of a deposited reaction product | prevention of an increase in the size of a via hole | prevention of the formation of a hollow portion | prevention of the rate of increase in the via resistance in the high-temperature storage resistance increase rate test |
|---|---|---|---|---|
| Embodiment 1 | ◯ | ◯ | Δ | Δ |
| Comparative Example 1 | X | ◯ | —(1) | —(2) |
| Comparative Example 2 | ◯ | X | X | X |

Removal of a deposited reaction product

◯: the deposited reaction product was completely removed.

X: the major portion of the deposited reaction product remained unremoved.

Prevention of an Increase in the Size of a Via Hole

◯: the difference in size of the via hole between before and after the cleaning was less than 30 nm.

X: the difference in size of the via hole between before and after the cleaning was 30 nm or more.

Prevention of the Formation of a Hollow Portion

◯: no formation of the hollow portion was observed.

Δ: a relatively small hollow portion was observed.

X: a relatively large hollow portion was observed.

(1) no formation of the hollow portion was observed because the deposited reaction product partly remained unremoved.

Prevention of the Rate of Increase in the Via Resistance in the High-temperature storage Resistance Increase Rate Test ◯: the rate of increase in the via resistance was less than 2%.

Δ: the rate of increase in the via resistance was not less than 2% nor more than 10%.

X: the rate of increase in the via resistance was more than 10%.

(2) the via resistance could not be measured because the deposited reaction product partly remained unremoved.

As Table 1 shows, the method for fabricating the electronic device of the first embodiment has entirely removed the reaction product 18 deposited on walls and the bottom surface of the via hole 17, and also restricted an increase in the size of the via hole 17 within less than 30 nm. On the other hand, this method has caused the formation of a relatively small-sized hollow portion 19, and had a rate of increase in the via resistance of not less than 2% nor more than 10% in the high-temperature storage resistance increase rate test.

The conductor film contained in the underlying wiring 14 in the first embodiment is composed of a multi-layered film comprising the aluminum alloy film 13 which has a relatively low corrosion resistance to, or is easily corroded by the fluorine compound contained in the first or the second cleaning solution. However, this multi-layered film could be replaced by a single-layered aluminum alloy film, a single-layered or a multi-layered aluminum film, or another metallic film not easily corroded by the fluorine compound.

The cleaning solution A used as the first cleaning solution in the first embodiment has a relatively low content of a fluorine compound having power to etch the insulator film 15; however, the first cleaning solution could be another cleaning solution having relatively low power to etch the insulator film 15.

The cleaning solution B used as the second cleaning solution in the first embodiment has a relatively high content of a fluorine compound having power to etch the insulator film 15; however, the second cleaning solution could be another cleaning solution having relatively high power to etch the insulator film 15.

The cleaning solution B used as the second cleaning solution in the first embodiment has relatively high power to etch the insulator film 15 and a relatively high capability of corroding the conductor film contained in the underlying wiring 14 during the rinse with water; however, the second cleaning solution could be another cleaning solution having relatively high power to etch the insulator film 15 and having a relatively low capability of corroding the conductor film contained in the underlying wiring 14 during the rinse with water. In this case, when the inside of the via hole 17 is rinsed with water immediately after the second cleaning solution is used, the conductor film contained in the underlying wiring 14 can be less corroded during the rinse with water. As a result, the third cleaning solution becomes unnecessary, thereby reducing the time required for the entire cleaning process.

In the first embodiment, when the cleaning solution having a relatively high capability of corroding the conductor film contained in the underlying wiring 14 during the rinse with water is used as the second cleaning solution, the process where the third cleaning solution is used can be omitted unless the performance of the electronic device to be fabricated is not influenced by deterioration of the conductor film contained in the underlying wiring 14 or an increase in the resistance value of the via contact formed by burying a conductor film into the via hole 17. The omission of the process can shorten the time required for the entire cleaning process.

The third cleaning solution in the first embodiment is identical with the first cleaning solution, namely, the cleaning solution A; however, the third cleaning solution could be another cleaning solution with a lower capability of corroding the conductor film contained in the underlying wiring 14 during the rinse with water than the second cleaning solution. In this case, it is preferable that the third cleaning solution has relatively low power to etch the insulator film 15.

The first and second cleaning solutions are used at room temperature or 23° C. in the first embodiment; however, they could be used in a range of 18° to 25° C. If the use of the first or the second cleaning solution in a range of 18° to 25° C. seriously decreases the rate of removing the reaction product 18, these solutions could be heated to around 35° to 60° C.

In the first embodiment, it is preferable that the temperatures and the duration in time to use the first to third cleaning solutions are determined by taking the state of the reaction product 18, or the type of the conductive film contained in the underlying wiring 14 into consideration.

In the first embodiment, the first to third cleaning solutions preferably contain the same organic solvent. This makes it unnecessary to provide each cleaning solution with an individual drain line, thereby centralizing the drain lines.

Cleaning methods with the first to third cleaning solutions available in the first embodiment include a batch type cleaning method where the substrate 11 or the substrate to be processed is soaked in a cleaning solution and a single wafer type or a batch type cleaning method where a cleaning solution is sprayed like a shower, discharged or dropped continuously or intermittently to the substrate to be processed while the substrate is being rotated.

In the first embodiment, the first to third cleaning solutions are preferably used in the same cleaning chamber. In that case, the time required for the entire cleaning process can be shortened, and the time can be further shortened if the process of rinsing the inside of the via hole 17 with water is done in the cleaning chamber where the first to third cleaning solutions have been used.

The first embodiment deals with the case where a via hole is formed by dry etching the insulator film formed on the wiring and then the reaction product deposited on walls or the bottom surface of the via hole is removed. In addition to this case, there are such cases that a contact hole is formed by dry etching the insulator film formed on the gate electrode of a MOS transistor and then the reaction product deposited on walls or the bottom surface of the contact hole is removed, and that a wiring pattern is formed by dry etching the conductor film formed on the insulator film and then the reaction product deposited on walls of the wiring pattern or in the vicinity of the wiring pattern is removed. In order to remove the reaction product deposited on walls or the bottom surface of the contact hole, it is preferable to use the first cleaning solution having relatively low power to etch the insulator film in which the contact hole is formed and then the second cleaning solution having relatively high power to etch the insulator film in that order. On the other hand, in order to remove the reaction product deposited on walls of the wiring pattern or in the vicinity of the wiring pattern, it is preferable to use the first cleaning solution having relatively low power to etch the conductive film contained in the wiring pattern and then the second cleaning solution having relatively high power to etch the conductive film in that order.

EMBODIMENT 2

The method for fabricating the electronic device of the second embodiment will be described with reference to FIGS. 2(a) to 2(d).

Figure 2A:
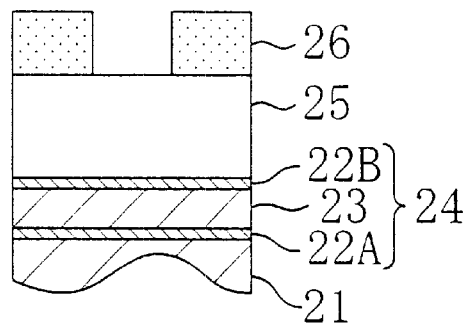
FIGS. 2(a) to 2(d) are cross sectional views showing the processes of the method for fabricating the electronic device of the second embodiment of the present invention.

First, as shown in FIG. 2(a), an underlying wiring 24 having a multi-layer structure consisting of a first titanium nitride film 22A, an aluminum alloy film 23 and a second titanium nitride film 22B is formed onto a substrate 21. After this, an insulator film 25 is formed on the underlying wiring 24, and a resist pattern 26 having an opening portion in the via hole formation region is formed on the insulator film 25.

Figure 2B:
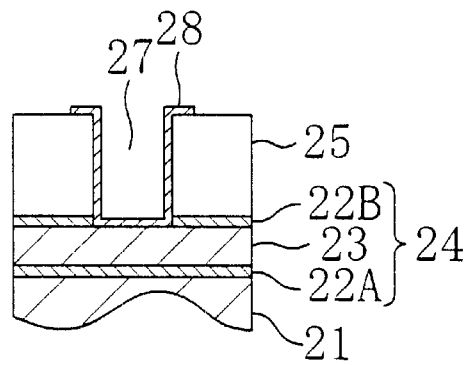

Later, the insulator film 25 and a second titanium nitride film 22B are sequentially dry etched by using the resist pattern 26 as a mask so as to form a via hole 27 as shown in FIG. 2(b), and then the resist pattern 26 is removed through plasma ashing.

At this moment, a reaction product 28 is deposited on walls and the bottom surface of the via hole 27.

In order to remove the reaction product 28, the inside of the via hole 27 is washed with a first cleaning solution having relatively low power to etch the insulator film 25, or having a relatively low content of a fluorine compound such as ELM-C30-A01 (hereinafter referred to as the cleaning solution A) manufactured by Mitsubishi Gas Chemical Co., Ltd. for 10 to 20 minutes at room temperature or 23° C.

Figure 2C:
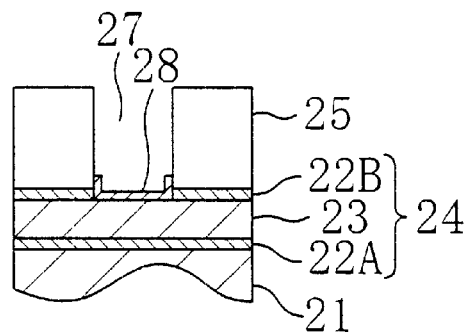

Since the first cleaning solution has relatively low power to etch the insulator film 25, the reaction product 28 is removed from the via hole 27 except the bottom surface of the via hole 27 and its vicinity as shown in FIG. 2(c) without causing an increase in the size of the via hole 27.

In order to remove the remaining reaction product 28, the inside of the via hole 27 is washed with a second cleaning solution having relatively high power to etch the insulator film 25, or having a relatively high content of a fluorine compound such as ELM-C30-A10 (hereinafter referred to as the cleaning solution B) manufactured by Mitsubishi Gas Chemical Co., Ltd. at room temperature or 23° C. for 30 seconds to 5 minutes in the cleaning chamber (not shown) where the first cleaning solution has been used. The cleaning solution B contains about 8 times as much fluorine compound, and has 50 to 200 times as high power to etch the insulator film 25 as the cleaning solution A. The etching power can be the amount of etching the same type of insulator film in the same duration in time.

Figure 2D:
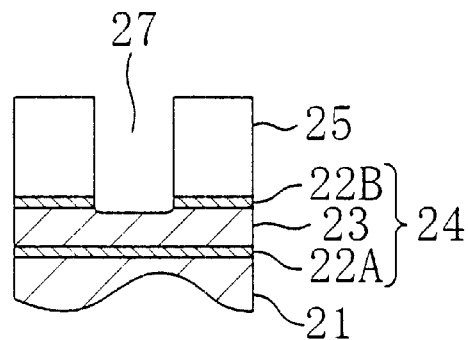
Figure 3A:
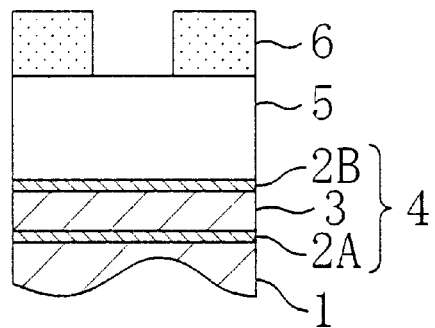
FIGS. 3(a) to 3(c) are cross sectional views showing the processes of the method for fabricating the electronic device of the first comparative example.
Figure 3B:
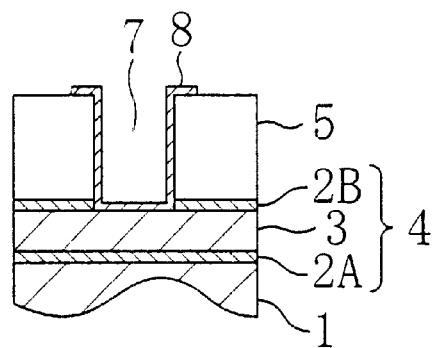
Figure 3C:
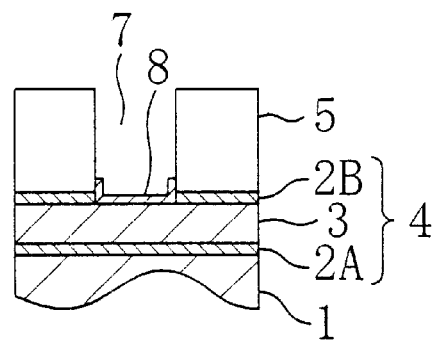
Figure 4A:
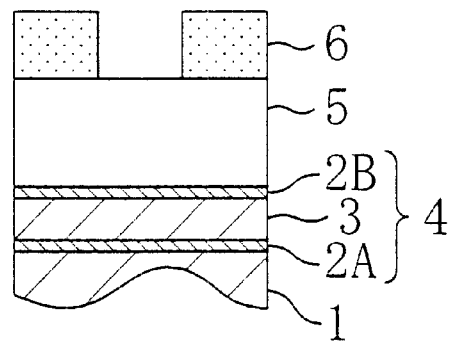
FIGS. 4(a) to 4(c) are cross sectional views showing the processes of the method for fabricating the electronic device of the second comparative example.
Figure 4B:
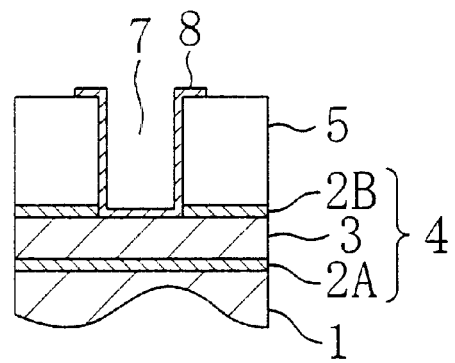
Figure 4C:
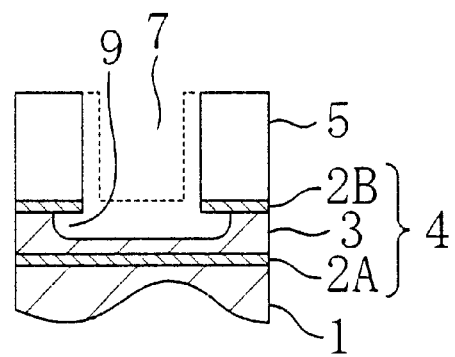
Figure 5A:
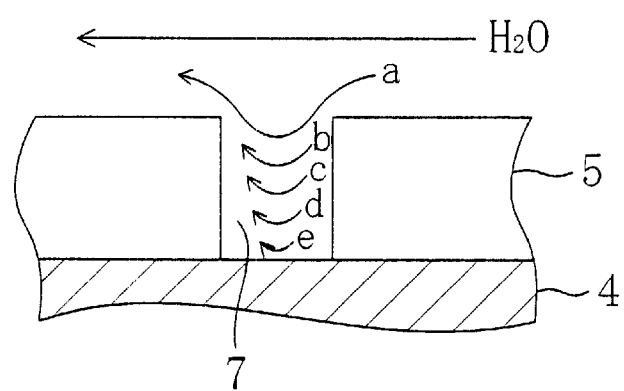
FIG. 5(a) is a cross sectional view showing the strengths of streams of water inside the via hole while the inside of the via hole is being rinsed with water in accordance with the method for fabricating the electronic device of the second comparative example.
Figure 5B:
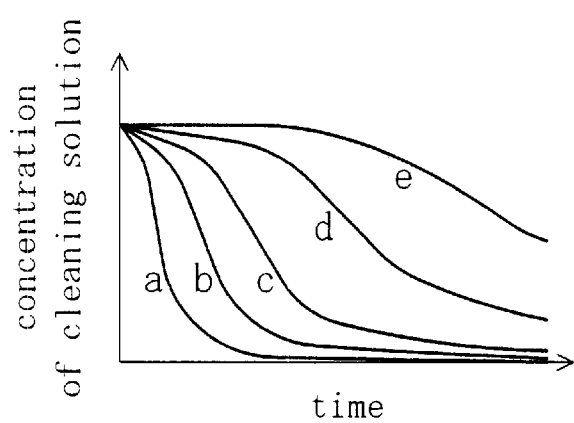
FIG. 5(b) is a view showing changes in the concentration of the cleaning solution inside the via hole while the inside of the via hole is being rinsed with water in accordance with the method for fabricating the electronic device of the second comparative example.

In this case, the reaction product 28 is partly removed by using the first cleaning solution having relatively low power to etch the insulator film 25, and then the remaining part of it is removed by using the second cleaning solution having relatively high power to etch the insulator film 25. This shortens the time to use the second cleaning solution, compared with the case where the reaction product 28 is removed by the second cleaning solution only. As a result, as shown in FIG. 2(d), the amount of etching the insulator film 25 can be reduced, which secures the removal of the reaction product 28 without increasing the via hole 27 in size.

If the inside of the via hole 27 washed with the second cleaning solution or the cleaning solution B were rinsed with water immediately, the cleaning solution B diluted by the water during the rinse would become capable of corroding the conductor film contained in the underlying wiring 24, namely, the aluminum alloy film 23. To be more specific, the ability of the cleaning solution B to corrode the aluminum alloy film 23 during the rinse with water, that is, the cleaning solution B's capability of corroding the aluminum alloy film 23 in rinse water, is about 3 times as high as the cleaning solution A's capability (the maximum value) of corroding the aluminum alloy film 23 in rinse water.

In order to avoid this problem, in the present embodiment, after the reaction product 28 is removed with the second cleaning solution and before the inside of the via hole 27 is rinsed with water, the second cleaning solution or the cleaning solution B remaining inside the via hole 27 is replaced by a third cleaning solution having substantially no power to etch the insulator film 25 and having substantially no capability of corroding the aluminum alloy film 23 during the rinse with water. To be more specific, the inside of the via hole 27 is washed with a cleaning solution having an organic solvent content of 1 to 60% in weight such as N,N-dimethylformamide (having no content of a fluorine compound or the like with power to etch the insulator film 25) as the third cleaning solution at room temperature or 23° C. for 30 seconds to 10 minutes in the cleaning chamber where the first and second cleaning solutions have been used. In this case, the aluminum alloy film 23 can be less corroded during the rinse with water than in the case where the inside of the via hole 27 is rinsed with water immediately after the second cleaning solution is used. Later, after the inside of the via hole 27 is rinsed with water in the cleaning chamber where the first to third cleaning solutions have been used, the substrate 21 is dried.

As described hereinbefore, in the present embodiment the reaction product 28 deposited on walls or the bottom surface of the via hole 27 formed in the insulator film 25 is removed by using the first cleaning solution with relatively low power to etch the insulator film 25 and the second cleaning solution with relatively high power to etch the insulator film 25 in that order. In this case, the reaction product 28 can be partly removed by the first cleaning solution, and then the remaining part of it can be removed by the second cleaning solution. This can shorten the time to use the second cleaning solution, compared with the case where the reaction product 28 is removed by the second cleaning solution only, thereby reducing the amount of etching the insulator film 25. This secures the removal of the reaction product 28 without increasing the via hole 27 in size.

Furthermore, after the reaction product 28 is removed with the first and second cleaning solutions and before the inside of the via hole 27 is rinsed with water, the inside of the via hole 27 is washed with a third cleaning solution having substantially no capability of corroding the aluminum alloy film 23 contained in the underlying wiring 24 during the rinse with water, thereby replacing the second cleaning solution remaining inside the via hole 27 by the third cleaning solution. As a result, the aluminum alloy film 23 is prevented from being corroded during the rinse with water, which avoids the formation of a hollow portion beneath the insulator film 25. Moreover, the aluminum alloy film 23 is substantially kept from being corroded. As a result, an acceleration test (high-temperature storage resistance increase rate test) applied to the via contact formed by burying a conductor film into the via hole 27 has indicated that an increase in the resistance value of via contact is securely prevented.

In the present embodiment, the use of the cleaning solution having substantially no power to etch the insulator film 25 as the third cleaning solution can prevent the insulator film 25 from being etched so as to prevent an increase in the size of the via hole 27.

Table 2 shows the results of comparisons among the second embodiment, the first comparative example and the second comparative example (refer to "SUMMARY OF THE INVENTION") with respect to the capabilities of removing the reaction product, preventing an increase in the size of the via hole, preventing the formation of the hollow portion, and preventing an increase in the resistance value of the via contact at the high-temperature storage resistance increase rate test (200° C., 1000 hours).

TABLE 2

| | removal of a deposited reaction product | prevention of an increase in the size of a via hole | prevention of the formation of a hollow portion | prevention of the rate of incease in the via resistance in the high-temperature storage resistance increase rate test |
|---|---|---|---|---|
| Embodiment 2 | ◯ | ◯ | ◯ | ◯ |
| Comparative Example 1 | X | ◯ | —(1) | —(2) |
| Comparative Example 2 | ◯ | X | X | X |

◯: the deposited reaction product was completely removed.

X: the major portion of the deposited reaction product remained unremoved.

Prevention of an Increase in the Size of a Via Hole

◯: the difference in size of the via hole between before and after the cleaning was less than 30 nm.

X: the difference in size of the via hole between before and after the cleaning was 30 nm or more.

Prevention of the Formation of a Hollow Portion

◯: no formation of the hollow portion was observed.

Δ: a relatively small hollow portion was observed.

X: a relatively large hollow portion was observed.

(1) no formation of the hollow portion was observed because the deposited reaction product partly remained unremoved.

Prevention of the Rate of Increase in the Via Resistance in the High-temperature Storage Resistance Increase Rate Test ◯: the rate of increase in the via resistance was less than 2%.

Δ: the rate of increase in the via resistance was not less than 2% nor more than 10%.

X: the rate of increase in the via resistance was more than 10%.

(2) the via resistance could not be measured because the deposited reaction product partly remained unremoved.

As Table 2 shows, the method for fabricating the electronic device of the second embodiment has entirely removed the reaction product 28 deposited on walls and the bottom surface of the via hole 27, and also restricted an increase in the size of the via hole 27 within less than 30 nm. Furthermore, this method has developed substantially no hollow portion, and had a rate of increase in the via resistance of less than 2% in the high-temperature storage resistance increase rate test.

The conductor film contained in the underlying wiring 24 in the second embodiment is composed of a multi-layered film comprising the aluminum alloy film 23 which has a relatively low corrosion resistance to, or is easily corroded by the fluorine compound contained in the first or the second cleaning solution. However, this multi-layered film could be replaced by a single-layered aluminum alloy film, a single-layered or a multi-layered aluminum film, or another metallic film not easily corroded by the fluorine compound.

The cleaning solution A used as the first cleaning solution in the second embodiment has a relatively low content of a fluorine compound having power to etch the insulator film 25; however, the first cleaning solution could be another cleaning solution having relatively low power to etch the insulator film 25.

The cleaning solution B used as the second cleaning solution in the second embodiment has a relatively high content of a fluorine compound having power to etch the insulator film 25; however, the second cleaning solution could be another cleaning solution having relatively high power to etch the insulator film 25.

The cleaning solution B used as the second cleaning solution in the second embodiment has relatively high power to etch the insulator film 25 and a relatively high capability of corroding the conductor film contained in the underlying wiring 24 during the rinse with water; however, the second cleaning solution could be another cleaning solution having relatively high power to etch the insulator film 25 and having substantially no capability of corroding the conductor film contained in the underlying wiring 24 during the rinse with water. In this case, when the inside of the via hole 27 is rinsed with water immediately after the second cleaning solution is used, the conductor film contained in the underlying wiring 24 can be prevented from being corroded during the rinse with water. As a result, the third cleaning solution becomes unnecessary, thereby reducing the time required for the entire cleaning process.

In the second embodiment, when the cleaning solution having a relatively high capability of corroding the conductor film contained in the underlying wiring 24 during the rinse with water is used as the second cleaning solution, the process where the third cleaning solution is used can be omitted unless the performance of the electronic device to be fabricated is not influenced by deterioration of the conductor film contained in the underlying wiring 24 or an increase in the resistance value of the via contact formed by burying a conductor film into the via hole 27. The omission of the process can shorten the time required for the entire cleaning process.

As the organic solvent contained in the third cleaning solution, 1 to 60% in weight of N,N-dimethylformamide is used in the second embodiment. Besides this material, the organic solvent could be 1 to 60% in weight, and preferably 5 to 50% in weight of such organic solvents as an amide group including formamide, N-methylformamide, N,N-dimethylacetamide, and N-methylpyrrolidone; a lactone group including γ-butyrolactone, an alcohol group including methanol, ethanol, isopropanol, and ethylene glycol; an ester group including methyl acetate, ethyl acetate, butyl acetate, methyl lactate, and ethyl lactate; a glycol ether group including ethylene glycol monobutyl ether, diethylene glycol monomethyl ether, and diethylene glycol monoethyl ether, and a nitrile group including acetonitrile, propionitrile, and butyronitrile.

The first and second cleaning solutions are used at room temperature or 23° C. in the second embodiment; however, they could be used in a range of 18 to 25° C. If the use of the first or the second cleaning solution in a range of 18 to 25° C. seriously decreases the rate of removing the reaction product 28, these solutions could be heated to around 35 to 60° C.

In the second embodiment, it is preferable that the temperatures and the duration in time to use the first to third cleaning solutions are determined by taking the state of the reaction product 28, or the type of the conductive film contained in the underlying wiring 24 into consideration.

In the second embodiment, the first to third cleaning solutions preferably contain the same organic solvent. This makes it unnecessary to provide each cleaning solution with an individual drain line, thereby centralizing the drain lines.

Cleaning methods with the first to third cleaning solutions available in the second embodiment include a batch type cleaning method where the substrate 21 or the substrate to be processed is soaked in a cleaning solution and a single wafer type or a batch type cleaning method where a cleaning solution is sprayed like a shower, discharged or dropped continuously or intermittently to the substrate to be processed while the substrate is being rotated.

In the second embodiment, the first to third cleaning solutions are preferably used in the same cleaning chamber. In that case, the time required for the entire cleaning process can be shortened, and the time can be further shortened if the process of rinsing the inside of the via hole 27 with water is done in the cleaning chamber where the first to third cleaning solutions have been used.

The second embodiment deals with the case where a via hole is formed by dry etching the insulator film formed on the wiring and then the reaction product deposited on walls or the bottom surface of the via hole is removed. In addition to this case, there are such cases that a contact hole is formed by dry etching the insulator film formed on the gate electrode of a MOS transistor and then the reaction product deposited on walls or the bottom surface of the contact hole is removed, and that a wiring pattern is formed by dry etching the conductor film formed on the insulator film and then the reaction product deposited on walls of the wiring pattern or in the vicinity of the wiring pattern is removed. In order to remove the reaction product deposited on walls or the bottom surface of the contact hole, it is preferable to use the first cleaning solution having relatively low power to etch the insulator film in which the contact hole is formed and then the second cleaning solution having relatively high power to etch the insulator film in that order. On the other hand, in order to remove the reaction product deposited on walls of the wiring pattern or in the vicinity of the wiring pattern, it is preferable to use the first cleaning solution having relatively low power to etch the conductive film contained in the wiring pattern and then the second cleaning solution having relatively high power to etch the conductive film in that order.

What is claimed is:

1. A method for fabricating an electronic device comprising:
    a first process of forming an insulator film onto a conductive pattern formed on a substrate;
    a second process of forming an opening portion in said insulator film by dry etching said insulator film using a resist pattern as a mask hereby forming a patterned insulator film, thereafter removing said resist pattern;
    a third process of removing a reaction product deposited on a wall or a bottom surface of said opening portion due to a plasma ashing of said resist pattern; and
    a fourth process of rinsing an inside of said opening portion rid of said reaction product with water;
    wherein the third process includes a process of removing a part of said reaction product by using a first cleaning solution to etch said atterned insulator film, thereafter removing the remaining part of said reaction product by using a second cleaning solution to etch said atterned insulator film, the first cleaning slution having lower power than the second cleaning solution.

2. The method of claim 1, wherein the first cleaning solution and the second cleaning solution contain a same organic solvent.

3. The method of claim 1, wherein the first cleaning solution and the second cleaning solution are used in a same cleaning chamber.

4. The method of claim 1 further comprising, between the third process and the fourth process, another process for washing the inside of said opening portion rid of said reaction product by using a third cleaning solution having a lower capability of corroding said conductor pattern in the fourth process than the second cleaning solution.

5. The method of claim 4, wherein the third cleaning solution has lower power than the second cleaning solution to etch said patterned insulator film.

6. The method of claim 4, wherein the third cleaning solution is the same as the first cleaning solution.

7. The method of claim 4, wherein the third cleaning solution substantially has no power to etch said patterned insulator film and substantially has no capability of corroding said conductive pattern in the fourth process.

8. A method for fabricating an electronic device comprising:
    a first process for forming a processed film on an underlying film formed on a substrate;
    a second process for forming an etched pattern by dry etching said processed film using a resist mask pattern, thereafter removing said resist mask pattern;
    a third process for removing a reaction product deposited on a wall of said etched pattern, due to plasma ashing of said resist mask pattern; and
    a fourth process for rinsing said etched pattern or a vicinity thereof rid of said reaction product with water;
    wherein the third process containing a process for removing a part of said reaction product by using a first cleaning solution to etch said etched pattern, thereafter removing the remaining part of said reaction product by using a second cleaning solution to etch said etched pattern, the first cleaning solution having lower power than the second cleaning solution.

9. The method of claim 8, wherein the first cleaning solution and the second cleaning solution contain a same organic solvent.

10. The method of claim 8, wherein the first cleaning solution and the second cleaning solution are used in a same cleaning chamber.

11. The method of claim 8 further comprising, between the third process and the fourth process, another process for washing said etched pattern or said vicinity thereof rid of said reaction product by using a third cleaning solution having a lower capability of corroding said underlying film in the fourth process than the second cleaning solution.

12. The method of claim 11, wherein the third cleaning solution has lower power than the second cleaning solution to etch said etched pattern.

13. The method of claim 11, wherein the third cleaning solution is the same as the first cleaning solution.

14. The method of claim 11, wherein the third cleaning solution substantially has no power to etch said etched pattern and substantially has no capability of corroding said underlying film in the fourth process.

* * * * *

UNITED STATES PATENT AND TRADEMARK OFFICE
CERTIFICATE OF CORRECTION

PATENT NO.   : 6,451,707 B2
DATED        : September 17, 2002
INVENTOR(S)  : Toshihiko Nagai et al.

It is certified that error appears in the above-identified patent and that said Letters Patent is hereby corrected as shown below:

<u>Title page,</u>
Item [73], delete "Matsushita Electronics Corporation" and add -- Matsushita Electric Industrial Co., Ltd. --

Signed and Sealed this

Eleventh Day of March, 2003

JAMES E. ROGAN
*Director of the United States Patent and Trademark Office*